US006724196B1

(12) United States Patent
Chiaro, Jr. et al.

(10) Patent No.: US 6,724,196 B1
(45) Date of Patent: Apr. 20, 2004

(54) TEMPERATURE CONTROLLED HIGH VOLTAGE REGULATOR

(75) Inventors: Peter J. Chiaro, Jr., Clinton, TN (US); Gerald K. Schulze, Knoxville, TN (US)

(73) Assignee: The United States of America as represented by the Department of Energy, Washington, DC (US)

( * ) Notice: Subject to any disclaimer, the term of this patent is extended or adjusted under 35 U.S.C. 154(b) by 57 days.

(21) Appl. No.: 10/229,044

(22) Filed: Aug. 28, 2002

(51) Int. Cl.[7] ................................................ G01R 27/02

(52) U.S. Cl. ......................... 324/609; 324/95; 324/685; 324/721; 323/907; 323/349; 327/378; 327/512; 327/513

(58) Field of Search .......................... 324/95, 609, 685, 324/714, 720, 721, 760; 323/273, 275, 276, 279, 349, 907; 327/378, 512, 513

(56) References Cited

U.S. PATENT DOCUMENTS

| | | | | |
|---|---|---|---|---|
| 3,126,508 A | | 3/1964 | Eriksson et al. | 323/273 |
| 3,505,583 A | | 4/1970 | Burkhardt et al. | 1/278 |
| 3,701,004 A | | 10/1972 | Tuccinardi et al. | 323/275 |
| 4,970,456 A | * | 11/1990 | Holcomb et al. | 324/95 |
| 5,862,046 A | * | 1/1999 | Farine et al. | 363/50 |
| 6,373,236 B1 | * | 4/2002 | Lemay et al. | 324/95 |

OTHER PUBLICATIONS

B. Denecke, et al., Gain Stabilisation of Gas–flow Proportional Counters, Applied Radiation and Isotopes, 1998 1117–1121, vol. 49, No. 9–11, Elsevier Science Ltd., Great Britain, no month is available.

M. Baaliouarner, et al., Gas gain measurement in helium–isobutane mixtures filled–proportional counters, Nuclear Instruments and Methods in Physics Research, May 6, 1996, 490–494, A 382, Elsevier Science Ltd., Great Britain.

F. J. Auerbach, et al., Pressure modulation for testing piezogravimetric gas sensors, Sensors and Actuators, 1995, 213–216, B 26–27, Elsevier Science Ltd., Great Britain, no month available.

* cited by examiner

*Primary Examiner*—N. Le
*Assistant Examiner*—Vincent Q. Nguyen
(74) *Attorney, Agent, or Firm*—Emily G. Schneider; Esther L. Roberts; Paul A. Gottleib

(57) ABSTRACT

A temperature controlled high voltage regulator for automatically adjusting the high voltage applied to a radiation detector is described. The regulator is a solid state device that is independent of the attached radiation detector, enabling the regulator to be used by various models of radiation detectors, such as gas flow proportional radiation detectors.

6 Claims, 10 Drawing Sheets

| Temperature °C | Voltage Reference @ U2a-pin 1 | Offset Voltage Vdc |
|---|---|---|
| -20 | +0.2350 | 23.5 |
| 0 | +0.7428 | 74.3 |
| 20 | +1.2547 | 125.5 |
| 30 | +1.522 | 152.2 |
| 40 | +1.7705 | 177.1 |
| 50 | +2.2896 | 229.0 |

FIG. 4

TEMPERATURE CONTROLLED HIGH VOLTAGE REGULATOR

BACKGROUND OF THE INVENTION

This invention relates to a temperature controlled high voltage regulator for count rate compensation of radiation detectors. The United States Government has rights to this invention pursuant to Contract No. DE-AC05-00OR22725 with UT-Battelle, LLC, awarded by the U.S. Department of Energy.

Radiation contamination technicians are often required to monitor for contamination in areas where temperature is uncontrolled. In order to perform this task, sensitive instrumentation is commonly used that incorporates gas flow proportional radiation detectors. This type of detector is used due to its excellent sensitivity to beta and alpha radiation and relative insensitivity to gamma radiation.

Unfortunately, these detectors are very susceptible to changes in temperature. As the temperature increases, the sensitivity increases; as the temperature decreases, the sensitivity decreases, relative to the original calibration temperature. This susceptibility can increase or decrease sensitivity resulting in radioactive contamination levels being mis-stated, missed entirely, or overstated, thus causing improper corrective actions to be taken.

Any change in ambient temperature causes immediate effects to the sensitivity of the detector due to changes that occur in the flow gas that is used. The typical gas used in the United States is P-10 (90% argon and 10% methane). Although changing gas pressure should work, this method is not possible due to detector design.

U.S. Pat. No. 3,505,583 to Burkhardt shows a high voltage regulator for providing a constant reference voltage to reactive loads such as RC timing circuits used in bomb fuses and other ordnance devices. Burkhardt's invention, however, is limited in scope to RC timing circuits and limited in purpose to the timing accuracy in ordnance devices and does not address the effect of temperature.

U.S. Pat. No. 3,126,508 to Eriksson shows a temperature dependent control of the output voltage of an energy source which is specially suitable for bridge networks. Eriksson's invention, however focuses on providing output voltage for stabilizing the bridge function.

U.S. Pat. No. 3,701,004 to Tuccinardi shows a circuit for producing a repeatable predetermined voltage as a function of temperature and including a component having a known temperature coefficient characteristic. Tuccinardi's invention, however, specifically states that the regulator discussed therein refers not to a constant voltage circuit, but instead to a circuit capable of a predetermined output voltage which varies in accordance with temperature.

Accordingly, a need in the art exists for a temperature controlled high voltage regulator for count rate compensation of radiation detectors which will reduce or eliminate the susceptibility of the detectors to changing temperature.

SUMMARY OF THE INVENTION

In view of the above need, it is an object of this invention to provide an apparatus that is capable of automatically adjusting the applied high voltage based upon the ambient temperature.

It is an object of this invention to provide an apparatus as in the above object that constantly senses temperature changes and adjusts high voltage to maintain a stable response reading in an attached radiation detector.

It is an object of this invention to provide an apparatus as in the above object that is easily interfaced with different radiation detectors.

It is an object of this invention to provide an apparatus as in the above object that is easily interfaced with different count rate meters.

It is an object of this invention to provide an apparatus as in the above object that has a silicon diode for the temperature sensor.

Briefly, the present invention is a temperature controlled high voltage regulator for count rate compensation of a radiation detector having an input voltage, an output voltage and a dc reference voltage. The regulator comprises a temperature sensor for measuring ambient air temperature; a sensing diode amplifier connected to the temperature sensor for providing a constant current through the temperature sensor; a dc voltage reference amplifier connected to the sensing diode amplifier for boosting the dc reference voltage; a temperature reference amplifier connected to the dc voltage reference amplifier for providing a temperature-proportional reference voltage for a connected error amplifier through the dc voltage reference amplifier, the connected error amplifier providing an amplified error signal for reading feedback voltage; a current controlled voltage attenuator connected to the error amplifier for regulating the output voltage to the attached radiation detector; a high voltage input and output sensor circuit, which includes two hi-Z input buffer amplifier for bufffering the sensor from loading effects and for adjusting any feedback voltage, connected to the current controlled voltage attenuator for measuring the input and output voltages; and a difference amplifier connected to the error amplifier for providing a ground referenced feedback voltage, connected in such manner so as to sense the variable temperature and adapt the input voltage such that the output voltage changes with temperature, permitting the radiation detector to perform at an enhanced level of accuracy, regardless of ambient temperature.

In one embodiment, the radiation detector is a gas flow proportional detector. In a preferred embodiment, the temperature sensor is comprised of a silicon diode, and the current controlled voltage attenuator is ground-referenced. The voltage reference amplifier is calibrated for boosting the dc reference voltage from about 200 milli-volts to about 760 milli-volts, and the current controlled voltage attenuator is isolated from the reference amplifier by a protective box so that calibration adjustments can be made safely.

Also provided is a method for controlling the high voltage to an attached radiation detector to enhance detection accuracy independent of ambient temperature, comprising the steps of: measuring ambient air temperature by using a temperature sensor; providing constant current through the temperature sensor by using a sensing diode amplifier; boosting a dc reference voltage by using a dc reference amplifier; providing a temperature-proportional reference voltage by using a temperature reference amplifier; regulating output voltage to the attached radiation detector by using a current controlled voltage attenuator; measuring input and output voltages by using a high voltage input and output sensor circuit which includes two hi-Z buffer amplifiers for buffering the sensor circuit from loading effects and for adjusting feedback voltage; reading feedback voltage by using an error amplifier to provide an amplified error signal; and providing a ground referenced feedback voltage to the error amplifier by using a difference amplifier so that the output voltage to the attached radiation detector changes with temperature, permitting the detector to perform at an enhanced level of accuracy, regardless of ambient temperature.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DESCRIPTION OF THE DRAWINGS

The accompanying drawings, which are incorporated in and form a part of the specification, illustrate preferred embodiments of the invention, and, together with the description, serve to explain principles of the invention.

FIG. 4 is a table showing offset voltage versus temperature.

Like reference numbers indicate identical parts.

DETAILED DESCRIPTION OF THE INVENTION

In view of the above need, a new invention, a temperature controlled high voltage regulator for an attached radiation detector which controls or adjusts the applied high voltage based upon the ambient temperature, was developed. The regulator is a solid state device that is independent of the radiation detector, thus the invention may be used with different models of radiation detectors. In one embodiment, the radiation detector is a gas flow proportional detector.

The temperature controlled high voltage regulator is used to control the high voltage applied to an attached radiation detector in order to compensate for detection efficiency variations versus temperature. No modification to the existing device or detector is necessary. Cables between the signal input of the count rate measuring device and the probe output connect to the regulator. A third small cable connects the regulator to a silicon diode used to sense temperature. No other connections are necessary, thus the invention is extremely easy to use. In one embodiment, a nominal linear voltage/temperature slope of 50 volts per 20 degrees was empirically determined to be close to optimum for a particular large area detector used with a count rate measuring device. Other detectors may require a different "gain factor" that is easily provided by the invention due to its wide range of high voltage control.

Figure 1:
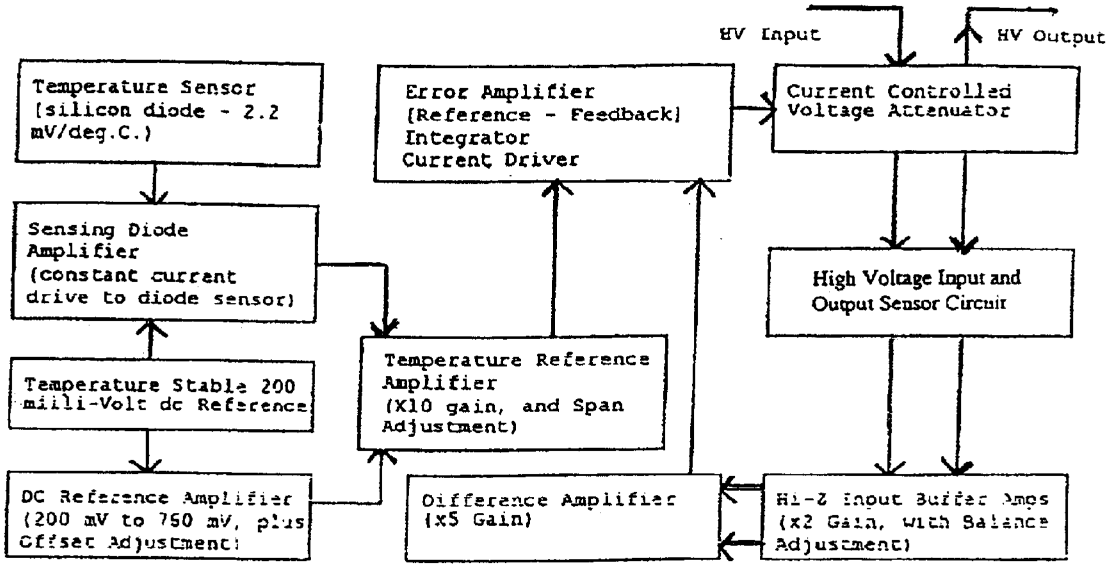
FIG. 1 is a block diagram of the temperature controlled high voltage regulator.

As shown in FIG. 1, the invention includes the following circuit blocks: a silicon diode temperature sensor, a dc voltage reference amplifier, a temperature reference amplifier, a current controlled voltage attenuator, a high voltage input and output sensor circuit which includes two hi-Z buffer amplifiers, an error amplifier, and a difference amplifier. A special feature of the circuitry is that the high voltage circuits are isolated and shielded in a protective box from the reference and control circuits that are ground-referenced so that adjustments can be made safely. In one embodiment, all circuits are contained within a die-cast metal box with an on/off switch with only the silicon diode temperature sensor connected remotely by a cable.

Figure 2:
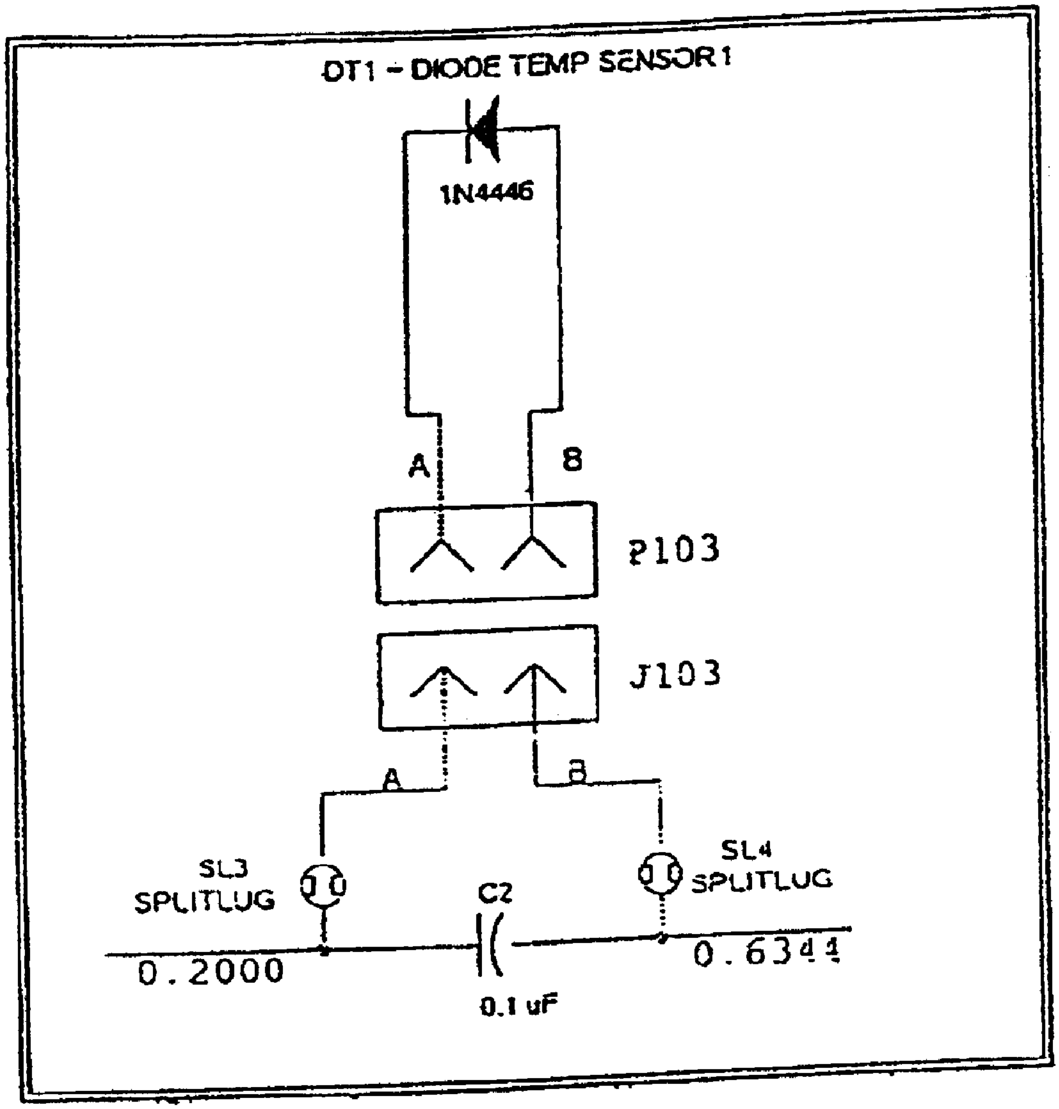
FIG. 2 is a diagram of the silicon diode temperature sensor.

Because a linear slope of high voltage out versus temperature is desired, a silicon diode was chosen for the temperature sensor, as shown in FIG. 2. Silicon is noted for having a constant voltage drop versus temperature of approximately −2.2 millivolts (mV) per degree C.; its voltage drop at constant current is higher at low temperatures and lower at high temperatures. Since a silicon diode also has an offset voltage and only a change in voltage relative to temperature is desired, it is necessary to subtract the offset voltage from the diode's voltage drop. In a preferred embodiment, a 1N4148 general purpose silicon diode DT1 is used for the temperature sensor. Not shown is a protective housing for the silicon diode temperature sensor DT1 which is open to sense the ambient air temperature. The silicon diode temperature sensor DT1 includes a 2-wire cable P103 A and B terminated with a connector J103 A and B that connects into the dc voltage reference amplifier as shown in FIG. 3.

Figure 3:
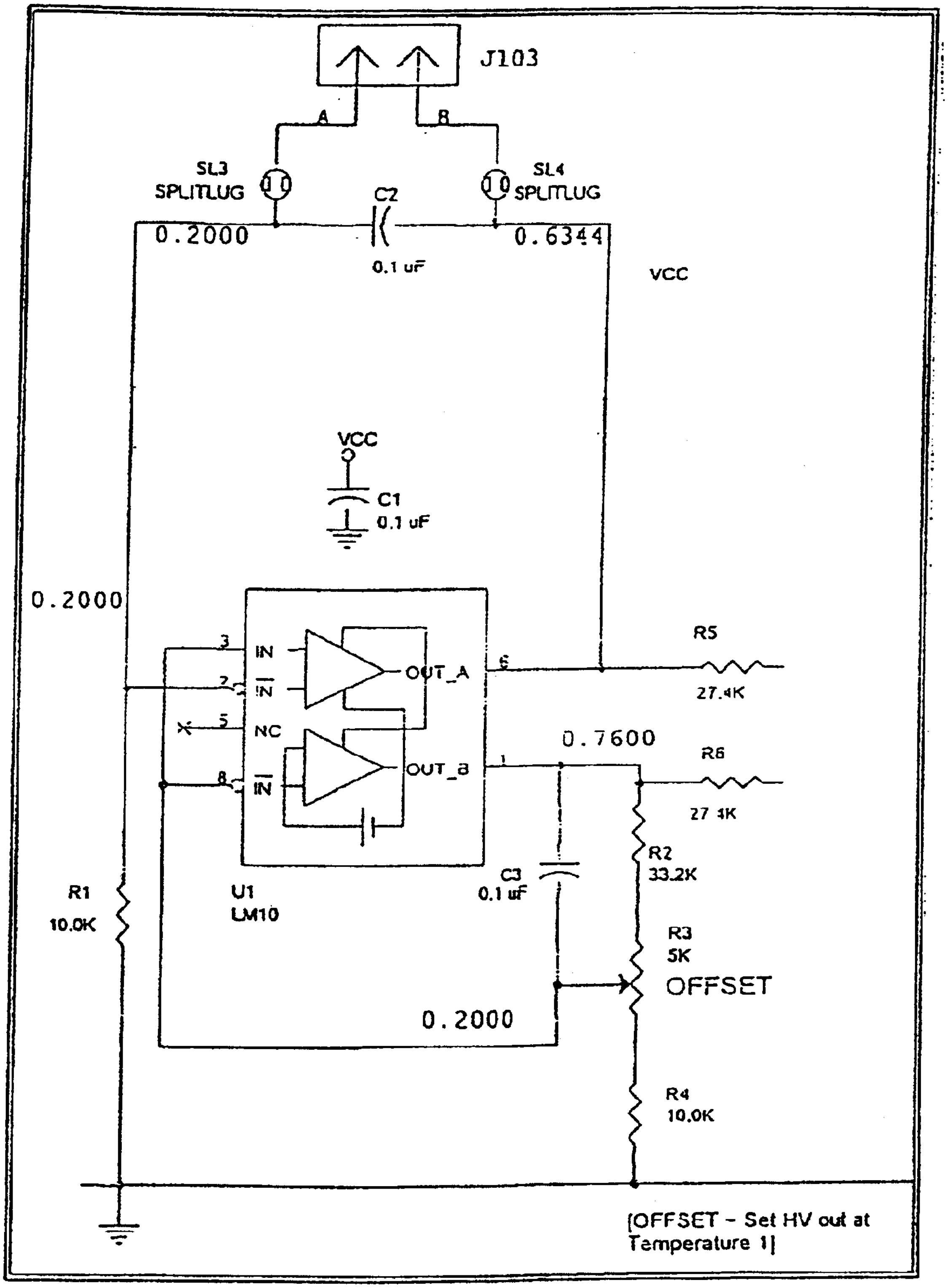
FIG. 3 is a diagram of the dc voltage reference amplifier.

FIG. 3 shows the dc voltage reference amplifier. The dc voltage reference amplifier is connected to the silicon diode temperature sensor DT1 (FIG. 2) and to the temperature reference amplifier (shown in FIG. 5). Silicon diode temperature sensor DT1 is connected to an operational amplifier (opamp) circuit package U1 LM10 that provides both a constant current through the silicon diode temperature sensor DT1 as well as a low impedance output. Opamp circuit package U1 LM10 is an 8-leaded device which has an internal temperature-compensated dc voltage reference source (not shown) and two operational amplifiers A and B, shown in FIG. 3. Opamp A is used in conjunction with silicon diode temperature sensor DT1. Opamp B is used to boost the temperature-compensated dc voltage reference (not shown) from about 200 milli-volts to about 760 milli-volts. The opamp circuit package U1 LM10 is manufactured such that the 200 mV reference voltage is internally connected to the non-inverting input of opamp B. Silicon diode temperature sensor DT1 (FIG. 2) is in the feedback path between the output U1-pin 6 and the inverting input U1-pin 2 of opamp A. Opamp A has its non-inverting input U1-pin 3 biased to 200 milli-volts which occurs at the wiper of potentiometer R3. Opamp A forces current through the silicon diode temperature sensor DT1 (FIG. 2) in its forward direction to make the voltage at the inverting input U1-pin 2 equal to the bias at the non-inverting input U1-pin 3. Since negligible bias current flows into opamp A, the majority of the current at the inverting input U1-pin 2 flows to ground through resistor R1 whose value is 10 kilo ohms. This establishes a constant current of −20 micro-amplifiers through the silicon diode temperature sensor DT1 (FIG. 2) and resistor R1 and causes an output voltage at output U1-pin 6 equal to the silicon diode temperature sensor DT1 (FIG. 2) voltage plus the 200 milli-volt bias voltage. At room temperature (20° C.), this is approximately 0.634 volts. The output U1-pin 1 of opamp B is connected to a voltage divider string comprised of resistor R2, potentiometer R3, and resistor R4. Potentiometer R3 has its wiper returned to the inverting input U1-pin 8 of opamp B. The resistor values in this voltage divider string are chosen to force the closed-loop gain of opamp B to equal approximately 3.8. This means that the 200 mV reference voltage is boosted to 760 milli-volts. The adjustment range of potentiometer R3 gives an output that ranges from approximately 0.3 vdc to approximately 2.0 vdc. Potentiometer R3 is adjusted to give the desired offset voltage at a particular temperature.

The table of FIG. 4 applies to a slope of 2.5 volts per degree C., with a minimum temperature of −20° C.

Figure 5:
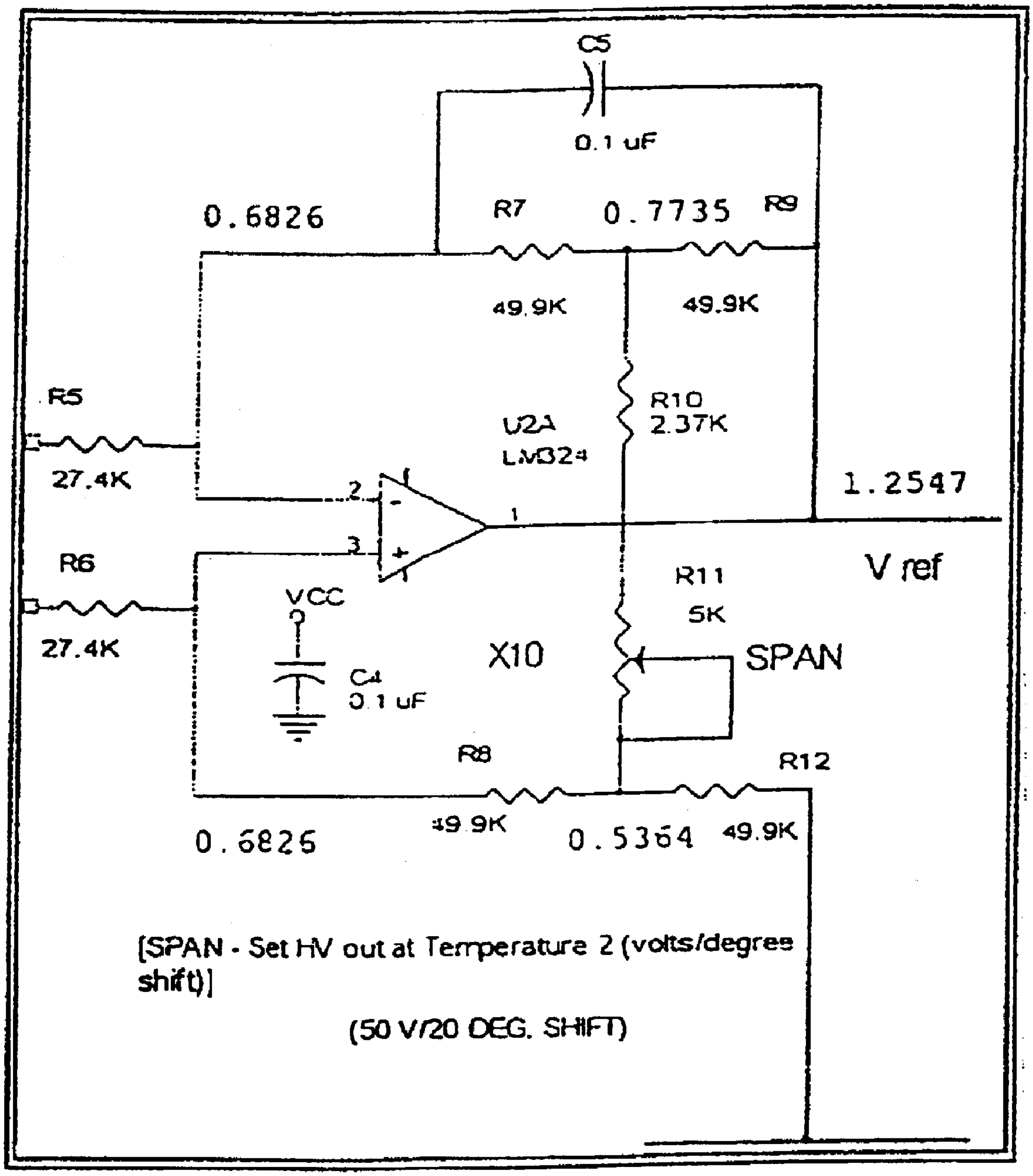
FIG. 5 is a diagram of the temperature reference amplifier.

FIG. 5 shows the temperature reference amplifier. The temperature reference amplifier is connected to the dc voltage reference amplifier (FIG. 3) and to the error amplifier (shown in FIG. 9). The temperature reference amplifier is connected at outputs U1-pin 1 (FIG. 3) and U1-pin 6 (FIG. 3) because an incremental voltage reference that varies with temperature is desired. The temperature reference amplifier is comprised of the opamp U2A which is a component of opamp circuit package OP484EP, resistors RS through R8 and potentiometer R11. The function of the temperature reference amplifier is to subtract the voltage of the silicon diode temperature sensor DT1 (FIG. 2) from the boosted, temperature-compensated dc voltage and to multiply the difference, by a fixed gain depending upon the desired slope of the output differential versus temperature. For a slope of 2.5 volts per 10° C., the gain is set to approximately 10. Thus, for example, at room temperature (20° C.), the 125.5 mV difference is boosted to 1.255 volts, where it is used as the temperature-proportional reference for the temperature controlled high voltage regulator. Since the output sensing circuitry produces a feedback voltage which is attenuated by 100:1, the output will vary at a rate of 100 volts for every 1 volt change in this reference voltage. Therefore the difference in the output voltage for a 1.255 volt reference will be 125.5 vdc. Potentiometer R11 is used to set the gain of the temperature reference amplifier thus it sets the slope or "span" of the output voltage versus temperature. Potentiometer R11 could be set by measuring the output at one temperature and then changing the temperature by a known amount, and resetting potentiometer R11 for the desired increment. Potentiometer R11 can also be set to a known gain by first measuring the differential voltage at U1 LM10 (FIG. 2) between U1-pin 1 (FIG. 2) and U1-pin 6 (FIG. 2), and then adjusting potentiometer R11 to give an output at U2A-pin 1 that is 10 times the measured input voltage.

Figure 6:
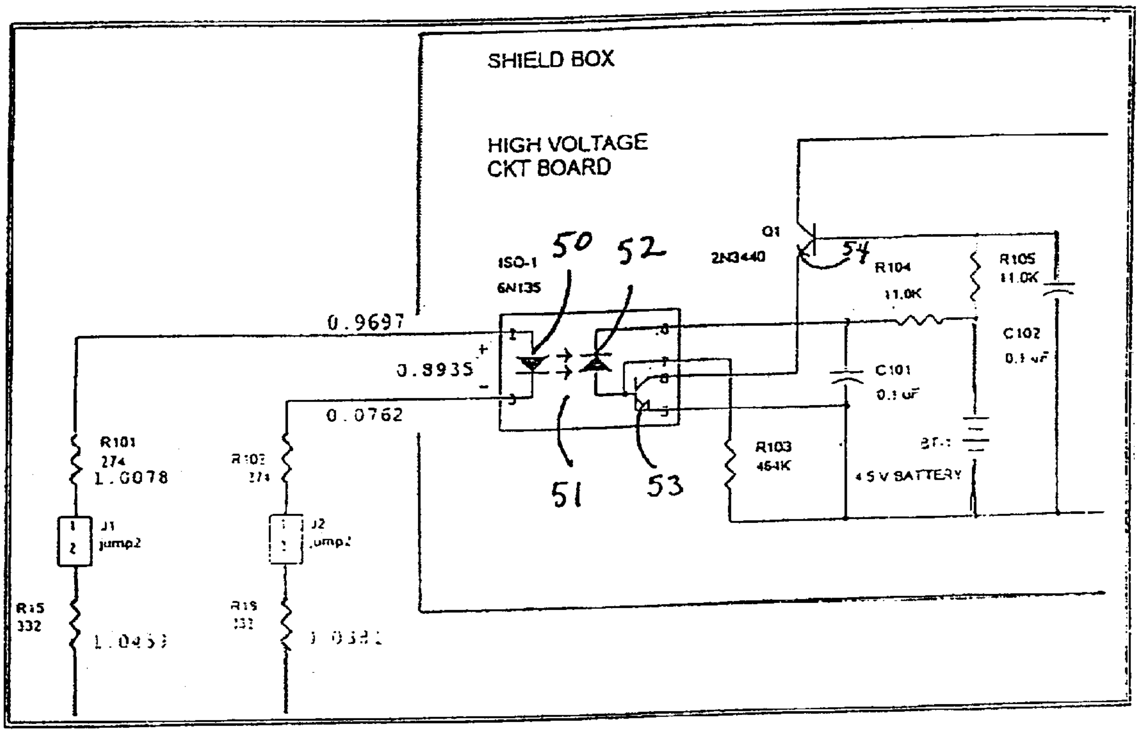
FIG. 6 is a diagram of the current controlled voltage attenuator.
Figure 7:
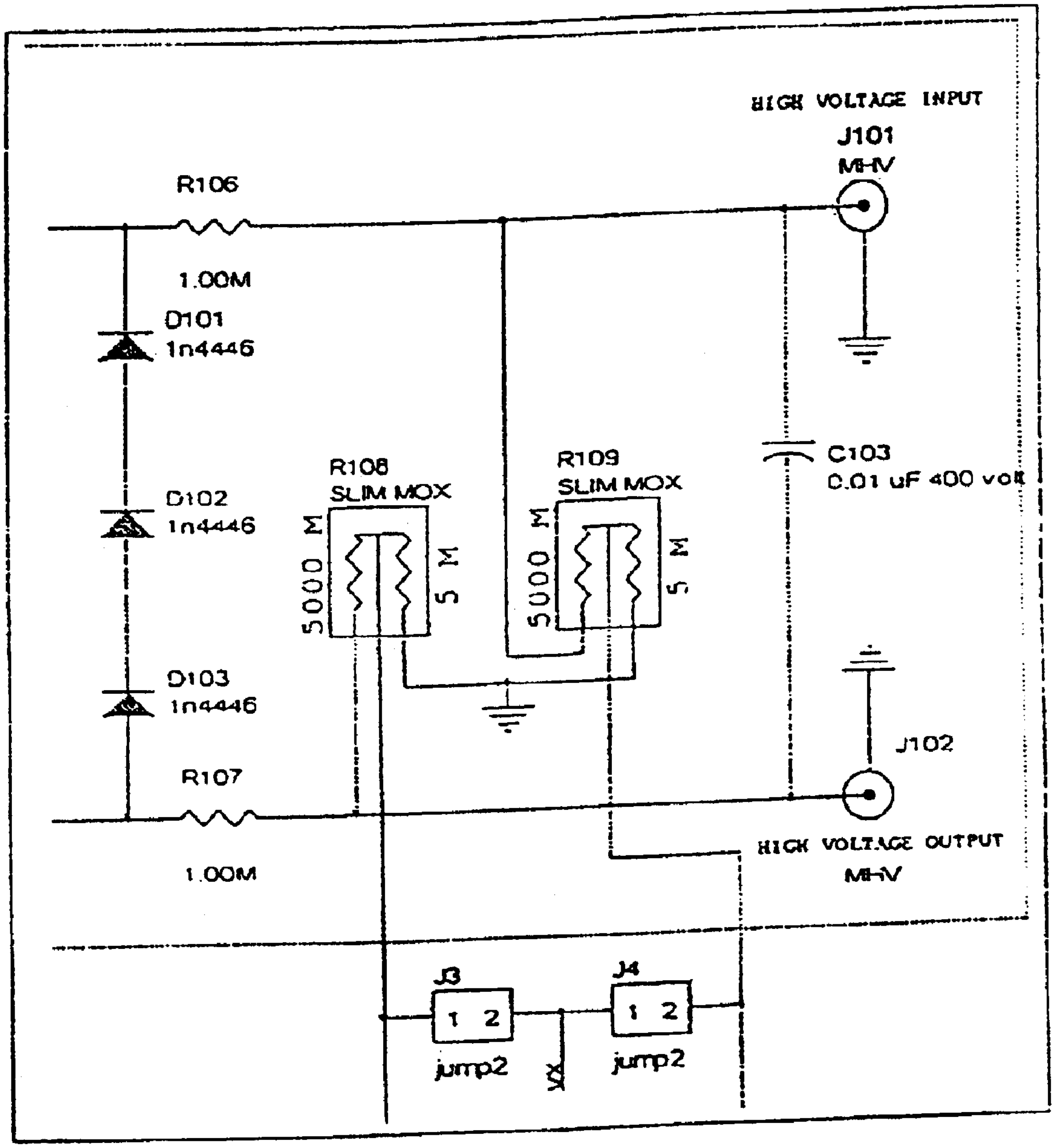
FIG. 7 is a diagram of the high voltage input and output sensor circuit.

As shown in FIG. 6, the input high voltage is attenuated through the current controlled voltage attenuator which is connected to the error amplifier (shown in FIG. 9) and the high voltage input and output sensor circuit (shown in FIG. 7). The drive current for the current controlled voltage attenuator comes through resistors R15, R10, R102 and R18. Included in the current controlled voltage attenuator is an optical isolator ISO-1 6N135. The light emitted by the internal light emitting diode (LED) 50 of optical isolator ISO-1 6N135 is controlled by the drive current that is applied to ISO-1-pin 2. The light is coupled from LED 50 across an isolating gap 51 into diode detector 52 that provides a small current drive into the base of the internal transistor 53 of optical isolator ISO-1 6N135; this causes the internal transistor 53 to conduct more current. The collector ISO-1-pin 6 of the internal transistor 53 of optical isolator ISO-1 6N135 is connected to the emitter of transistor Q1. The collector of transistor Q1 is connected to the high voltage input through resistor R106 (shown in FIG. 7). As transistor Q1 conducts more current, the high voltage output is raised. Conversely, as the drive current into ISO-1 6N135 is decreased, the high voltage output will also decrease, because the light emitted by the internal LED decreases, thus decreasing the amount of current being conducted by the internal transistor of ISO-1 6N135. The novelty of this circuit is the effects of gain variations of transistor Q1 are minimized because the emitter of Q1 is driven with the base grounded. In one embodiment, jumpers J1 and J2 are provided so that the current controlled voltage attenuator can be independently checked.

FIG. 7 shows the high voltage input and output sensor circuit. This circuit is connected to the current controlled voltage attenuator (FIG. 6) and to the hi-Z buffer amplifier circuit (shown in FIG. 8). Diodes D101, D102 and D103 act as zeners to limit the maximum voltage drop across transistor Q1 (FIG. 6). Resistors R106 and R107, along with diodes D101, D102 and D103, limit the current provided to the current controlled voltage attenuator (FIG.6). Capacitor C103 bypasses the signal from connectors J102 to J101 to prevent the impedance of the circuitry from affecting the signal amplitude. The input and output high voltages are sensed by resistor divider modules R108 and R109, known as "Slim-MOX™." (Inovision, Cleveland, Ohio). These resistor divider modules R108 and R109 provide a resistor divider module ratio of approximately 1000:1. There are negligible voltage and temperature effects on resistor divider modules R108 and R109 because they are mounted on the same substrate.

Figure 8:
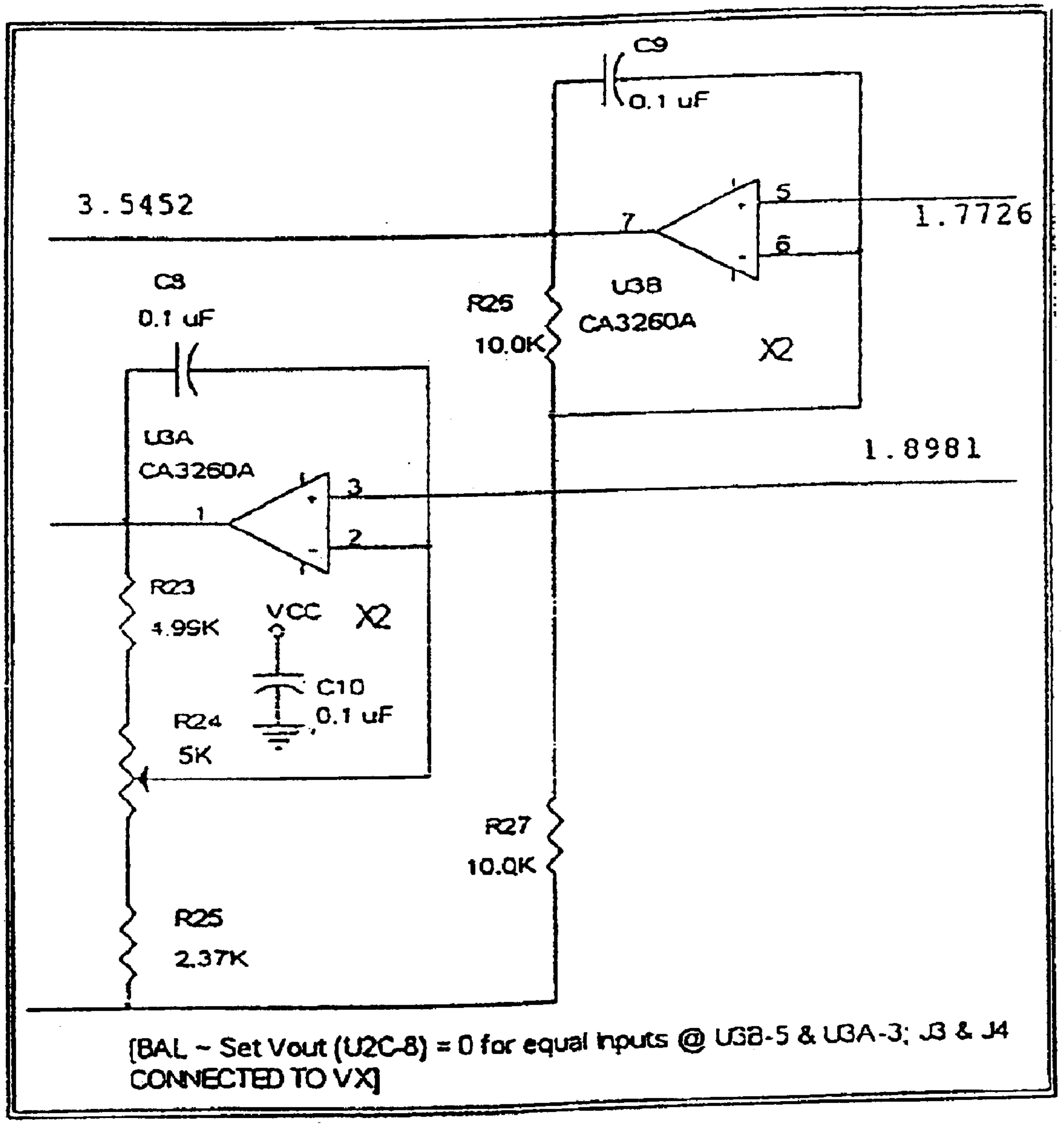
FIG. 8 is a diagram of the hi-Z buffer amplifiers.

FIG. 8 shows the hi-Z buffer amplifier circuit which includes opamp circuit package CA3260A which is comprised of opamps U3A and U3B. The hi-Z buffer amplifier circuit is connected to the high voltage input and output sensor circuit (FIG. 7) and to the difference amplifier (shown in FIG. 10) Opamps U3A and U3B are connected as voltage followers with a gain of approximately +2 each. They are used to buffer the resistor divider modules R108 and R109 (FIG. 7) from loading effects and for adjusting the feedback voltage for zero output for zero input differentials. The amplifier circuit for sensing high voltage output is comprised of opamp U3B, resistors R26 and R27 and capacitor C9. Since resistors R26 and R27 have equal fixed values of 10 kilo ohms each, the feedback ratio of the amplifier circuit gives a gain of approximately +2. The amplifier circuit for sensing high voltage input is comprised of U3A, resistor R23, potentiometer R24, resistor R25 and capacitor C8. Potentiometer R24 is used to adjust the feedback ratio of the high voltage input amplifier circuit to give a gain of approximately +2 and has a gain range of approximately 1.7 to approximately 5.2.

Figure 9:
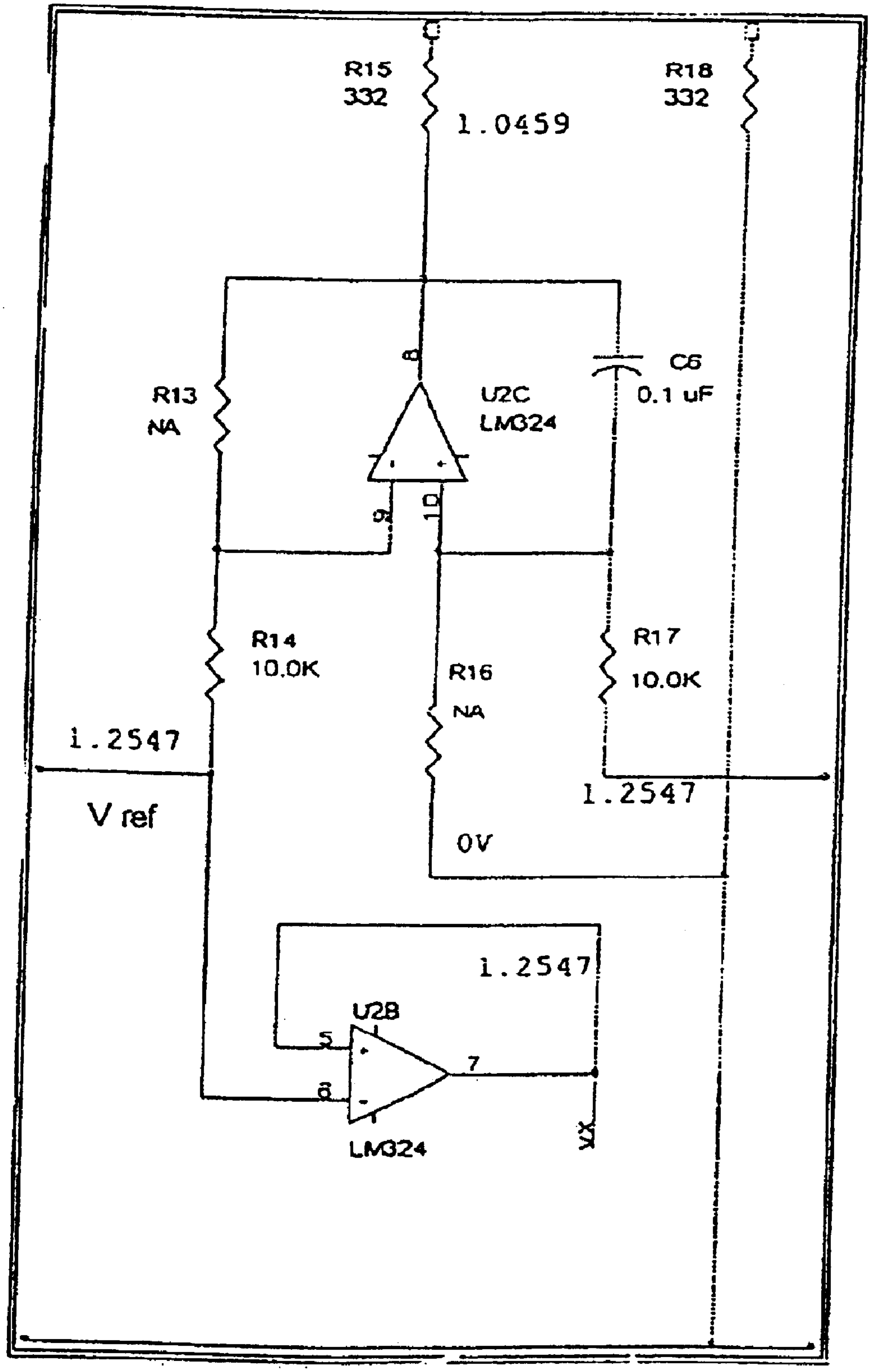
FIG. 9 is a diagram of the error amplifier.

FIG. 9 shows the error amplifier, which is comprised of the following: unity gain buffer U2B and opamp U2C, both of which are components of opamp circuit package OP484EP, resistors R14, R15, R16, R17, and R18, and capacitor C6. Unity gain buffer U2B prevents circuit loading on the temperature reference amplifier (FIG. 5). Capacitor C6 and resistor R14 set the low pass frequency of the control loop to provide stability for the error amplifier. The value of capacitor C6 was determined empirically by observing the error amplifier output at opamp U2C-pin 8 until the output was not oscillatory. The error amplifier is connected to the temperature reference amplifier (FIG. 5) and to the difference amplifier (shown in FIG. 10).

Figure 10:
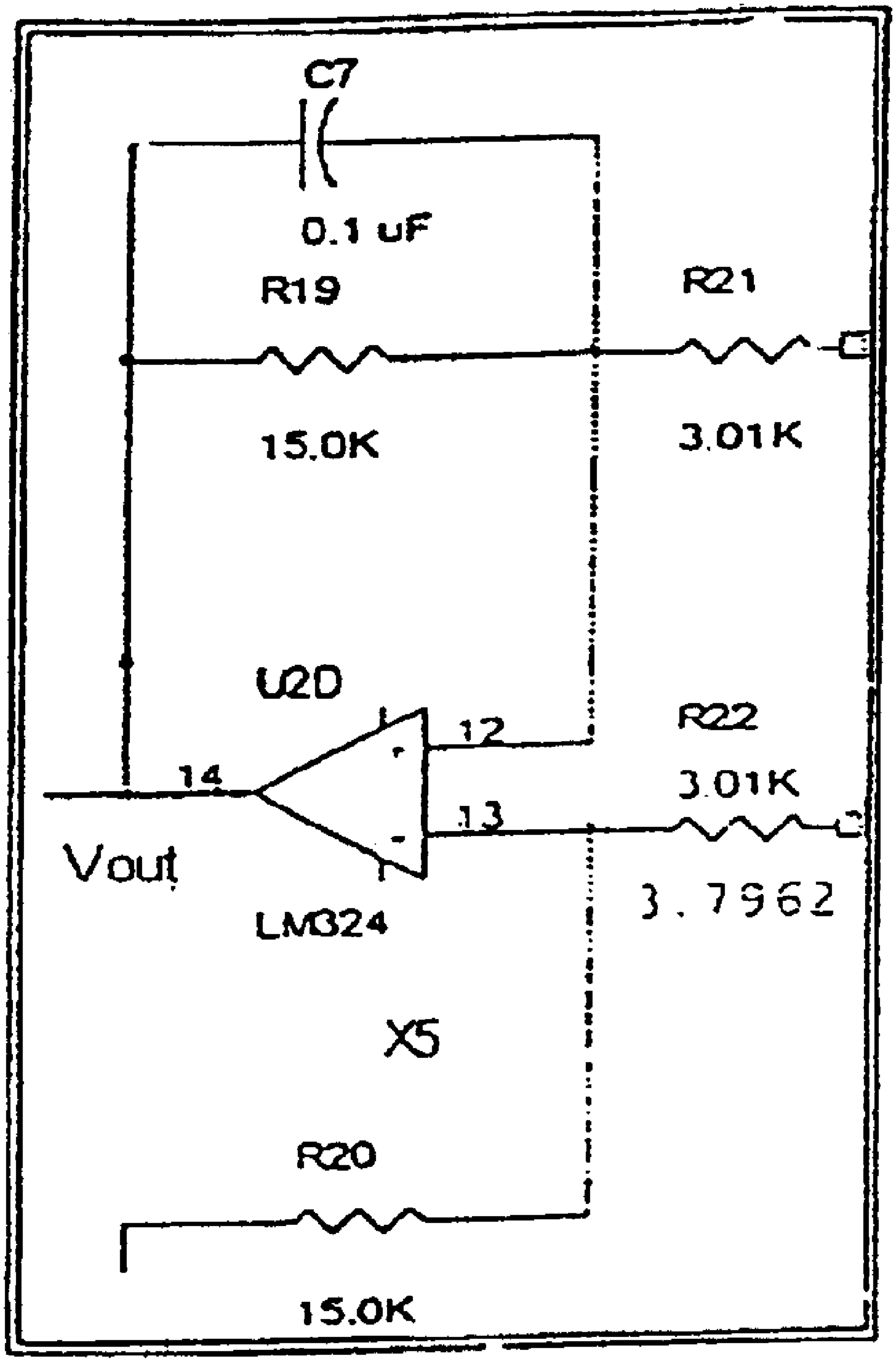
FIG. 10 is a diagram of the difference amplifier.

FIG. 10 shows the difference amplifier with a fixed gain of approximately 5, comprised of opamp U2D which is a component of opamp circuit package OP484EP, resistors R19, R20, R21 and R22, and capacitor C7. The difference amplifier is connected to the error amplifier (FIG. 9) and the hi-Z buffer amplifier circuit (FIG. 8). The difference amplifier's main purpose is to provide a ground-referenced feedback voltage to the error amplifier (FIG. 9).

In the present invention, it is desirable that U1 (FIG. 3) produces a constant voltage of 760 milli-volts and a temperature dependent voltage of 634 milli-volts at 20° C.

which varies at approximately −2.5 mv per ° C.; as temperature goes up, this voltage goes down. The two voltages are subtracted from each other, the larger constant voltage minus the smaller temperature dependent voltage, so that the difference between the two becomes larger as temperature increases. When multiplied by a gain of 10, a temperature dependent reference voltage (Vref) of 1.255 volts at 20° C. that increases with increasing temperature is the result.

As Vref increases positively with increasing temperature, the error amplifier's current output decreases with increasing temperature, reducing the drive to the optical isolator ISO-1 (FIG. 6) and transistor Q1 (FIG. 6). The reduced drive to transistor Q1 (FIG. 6) causes it to have a larger voltage drop due to its smaller conduction current flowing into the high voltage output's load resistance (primarily the resistor R109 (FIG. 7)).

The lower drop at the high voltage output into the sensing resistor string D101, D102, and D103 (FIG. 7) produces a lower output at hi-Z buffer opamp U3B (FIG. 8). Since this output is subtracted from the sensed high voltage input buffer's output, which is fixed, the difference between the two inputs becomes larger. When applied to the non-inverting input of the error amplifier (FIG. 9), the increased positive signal at the non-inverting input tends to increase the current drive from the error amplifier (FIG. 9) in opposition to the decrease demanded by the, increased reference at the inverting input. This forces a new balance condition for the error amplifier output current.

Not shown is a switch at S1 which is a double pole single throw switch so that when the temperature controlled high voltage regulator is not being used in the "on" mode, it can either be "off" or placed into a "by-pass" mode. In the "by-pass" mode, the bias is applied so that the current controlled voltage attenuator is drive "on" and the high voltage output attenuation is minimal.

Jumpers can be added to connect the inputs of the hi-Z buffer amplifier circuit (FIG. 8) to the reference voltage Vx. With the same input into both amplifiers, the balance adjustment, potentiometer R24 (FIG. 8), can be adjusted to set Vout at U2C-pin 8 (FIG. 9).

Offset and span adjustments are interrelated and are best set by the following procedure. Establish a temperature "T1 " at a desired operating point and adjust offset potentiometer R3 (FIG. 3) for the desired high voltage operating point. Then establish a second temperature "T2" and adjust span potentiometer R11 (FIG. 5) to give the desired high voltage output. In one embodiment, this was set to give a slope of 50 vdc for 20° C. temperature shift.

EXAMPLE

The following example is given to illustrate the process of the invention and is not to be taken as limiting the scope of the invention that is defined in the appended claims.

A temperature controlled high voltage regulator aligned for a slope of approximately 50 volts output decrease per 20° C. At U1 (FIG. 3), set offset potentiometer R3 (FIG. 3) to give 0.0 +/−0.5 millivolt offset between U1-pin 1 (FIG. 3) and U1-pin 6 (FIG. 3) in order to check offset voltage at U2A-pin 1 (FIG. 5) to ground. (Note: this point will not swing completely to ground, but should approach zero; the final value should be between 0 and 35 millivolts). Check voltage at U1-pin 6 (SL-4) (FIG. 3), which should he at approximately 0.6344 volts at 20° C. Voltage at U1-pin (SL-3) should be approximately 0.2000 vdc. Offset potentiometer R3 (FIG. 3) should have a range of from approximately 0.35 vdc to 2.0 vdc. For a 20° C. ambient, reset offset potentiometer R3 (FIG. 3) to give 125 millivolts between U1-pin 1 (FIG. 3) and U1-pin 6 (FIG. 3) in order to set the span potentiometer R11 (FIG. 5) adjustment to give a gain of ×10 in U2A (FIG. 5). Set the span potentiometer R11 (FIG. 5) to give 1.25 vdc at U2A-pin 1 (FIG. 5). Install jumpers J3 (FIG. 7) and J4 (FIG. 7) in the shorted position and connect Vx to both U3A-pin 3 (FIG. 8) and U3B-pin 5 (FIG. 8) inputs. Adjust balance potentiometer R24 (Fig 8) for a null (0 vdc) between U3B-pin 7 (FIG. 8) and U3A-pin 1 (FIG. 8). (Note: this point will not swing completely to ground, but should approach zero; the final value should be between 0 and 35 millivolts). Reinstall jumpers J3 and J4 (FIG. 7) in the open position.

Thus, it will be seen that a temperature controlled high voltage regulator has been provided. The regulator is a solid state device that is independent of the attached radiation detector, enabling the regulator to be used by various models of radiation detectors, such as gas flow proportional detectors. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A temperature controlled high voltage regulator for an attached radiation detector having an input voltage, an output voltage, and a dc reference voltage, said regulator comprising:

a) a temperature sensor for measuring ambient air temperature;

b) a sensing diode amplifier connected to said temperature sensor for providing a constant current through said temperature sensor;

c) a dc voltage reference amplifier connected to said sensing diode amplifier for boosting said dc reference voltage;

d) a temperature reference amplifier for providing a temperature-proportional reference voltage for a connected error amplifier through said dc voltage reference amplifier, said connected error amplifier providing an amplified error signal for reading feedback voltage;

e) a current controlled voltage attenuator connected to said error amplifier for regulating said output voltage to said attached radiation detector;

f) a high voltage input and output sensor circuit for measuring said input and output voltages, said high voltage input and output sensor circuit including two hi-Z input buffer amplifiers for buffering said high voltage input and output sensor circuit from loading effects and for adjusting any feedback voltage; and g) a difference amplifier connected to said error amplifier for providing a ground referenced feedback voltage to said error amplifier.

2. The temperature controlled high voltage regulator as set forth in claim 1 wherein said temperature sensor is further comprised of a silicon diode.

3. The temperature controlled high voltage regulator as set forth in claim 1 wherein said current controlled voltage attenuator is ground referenced.

4. The temperature controlled high voltage regulator as set forth in claim 1 wherein said voltage reference amplifier is calibrated for boosting said dc reference voltage from about 200 milli-volts to about 760 milli-volts.

5. The temperature controlled high voltage regulator as set forth in claim 1 wherein said current controlled voltage attenuator is isolated from said reference amplifier by a protective box so that calibration adjustments can be made safely.

6. A method for controlling the high voltage to an attached radiation detector to enhance detection accuracy independent of ambient temperature, said method comprising the steps of:

a) measuring ambient air temperature by using a temperature sensor;

b) providing constant current through said temperature sensor by using a sensing diode amplifier;

c) boosting a reference dc voltage by using a reference amplifier;

d) providing a temperature-proportional reference reading by using a temperature reference amplifier;

e) regulating output voltage to said attached radiation detector by using a current controlled voltage attenuator;

f) measuring input and output voltages by using a high voltage input and output sensor circuit, said high voltage input and output sensor circuit including two hi-Z buffer amplifiers for buffering said high voltage input and output sensor circuit from loading effects and for adjusting feedback voltage;

g) reading feedback voltage by using an error amplifier to provide an amplified error signal; and h) providing a ground referenced feedback voltage to said error amplifier by using a difference amplifier so that the output voltage to said attached radiation detector changes with temperature, permitting said radiation detector to perform at an enhanced level of accuracy, regardless of ambient temperature.

* * * * *